United States Patent [19]

Hermann et al.

[11] Patent Number: 5,217,943
[45] Date of Patent: Jun. 8, 1993

[54] PROCESS FOR MAKING COMPOSITE CERAMIC SUPERCONDUCTING WIRES

[75] Inventors: Allen M. Hermann; Zhengzhi Sheng; Q. A. Shams, all of Fayetteville, Ark.

[73] Assignee: The University of Arkansas, Little Rock, Ark.

[21] Appl. No.: 301,444

[22] Filed: Jan. 25, 1989

[51] Int. Cl.$^5$ .......................... B05D 1/18; B05D 5/12
[52] U.S. Cl. ........................................ 505/1; 505/733; 505/740; 505/704; 505/742; 427/62; 427/117; 427/120; 427/443.2
[58] Field of Search .................. 505/1, 704, 740, 733, 505/739, 742; 148/240, 242; 427/62, 117, 120, 430.1, 443.2; 29/599

[56] References Cited

U.S. PATENT DOCUMENTS 3,925,579 12/1975 Flinchum et al. .................. 427/320

FOREIGN PATENT DOCUMENTS 63-318025 12/1988 Japan .

OTHER PUBLICATIONS

Jin et al, "Fabrication of Dense $Ba_2YCUO_{7-8}$ Superconductor Wire by Molten Oxide Processing", Appl. Phys. Lett. 51 (12) Sep. 1987 pp. 943-945.

Kumakura et al, "Ba-Y-Cu-O Superconducting Tape Prepared by Surface Diffusion Process", Jpn. J. Appl. Phys. 27(7) Jul. 1987 L1172-1173.

Tsurumi, S., High $T_c$ Superconductivities of $A_2Ba_4Cu_6O_{14+y}$, Japan Journal of Applied Physics, vol. 26, No. 5, May, 1987, L856-L857.

Superconductivity News, vol. 1, No. 2, Aug. 1987, pp. 1, 2, and 6-8.

Yang, K. N., High Temperature Superconductivity in Rare-Earth (R)-Barium Copper Oxides (RBa$_2$) $Cu_3O_9$, Solid State Communications, vol. 63, No. 6, 1987, pp. 515-519.

Hasegawa, T., High $T_c$ Superconductivity of $(La_{1-x}Sr_x)_2CuO_4$-Effect of Substitution of Foreign Ions for Cu and La on Superconductivity, Japan Journal Applied Physics, vol. 26, No. 4, Apr. 20, 1987, L337-L338.

Kishio, K., Effect of Lanthanide Ion Substitutions for Lanthanum Sites on Superconductivity of $(La_{1-x}Sr_x)_2CuO_4$, Japan Journal of Applied Physics, vol. 26, No. 4, Apr. 20, 1987, L391-L393.

Ohshima, S., Superconducting and Structural Properties of the New $Ba_{1-x}Ln_xCuO_{3-y}$ Compound System (Ln=La, Ce, Pr, Nd, Sm, Eu, Gd, TB, Dy, Ho, Er and Yb), Japan Journal of Applies Physics, vol. 26, No. 5, May 20, 1987, L815-L817.

Tarascon, J. M., Oxygen and Rare-Earth Doping of the 90–K Superconducting Perovskite $YBa_2Cu_3O_{7-x}$, The American Physical Society, vol. 36, No. 1, 1987, pp. 226-234.

Hor, P. H., Superconductivity Above 90 K in the Square–Planar Compound System $ABa_2Cu_3O_{6+x}$ with A= Y, La, Nd, Sm, Eu, Gd, Ho, Er, and Lu, The American Physical Society, vol. 58, No. 18, 1987, pp. 1891-1894.

Khurana, A., Superconductivity Seen Above the Boiling Point of Nitrogen, Physics Today, Apr. 1987, pp. 17-23.

Cava, R. J., Bulk Superconductivity at 91 K in Single–Phase Oxygen–Deficient Perovskite $Ba_2YCu_3O_9$, The American Physical Society, vol. 58, No. 16, 1987.

Ishida, T., Compositional Variation of High $T_c$ in $Yb_xEr_{1-x}Ba_2Cu_3O_{6+y}$ System, Japan Journal of Applied Physics, vol. 26, No. 8, Aug. 1987, L1294-L1295.

Primary Examiner—Shrive Beck
Assistant Examiner—Roy V. King
Attorney, Agent, or Firm—Hermann Ivester

[57] ABSTRACT

A high temperature superconducting wire and an improved process of making the same wherein a metal wire chosen from the group consisting of: Y; Sm; Eu; Gd; Dy; Ho; Er; Tm; Yb; and Lu is oxidized and the oxidized metal wire is then coated with molten barium-copper-oxide. The process allows high-quality superconducting wire to be easily and continuously fabricated.

16 Claims, 3 Drawing Sheets

PROCESS FOR MAKING COMPOSITE CERAMIC SUPERCONDUCTING WIRES

BACKGROUND OF THE INVENTION

The present invention relates generally to high temperature superconductors. More specifically, the present invention relates to a superconducting wire and a method for the fabrication of high temperature superconducting wires.

A variety of superconducting systems are known, as well as methods for making same. In trying to create a superconducting system, one concern is to provide a superconducting system that will provide a superconductor that can be fabricated into a usable shape, such as, for example, a wire.

U.S. patent application Ser. No. 07/089,067, filed on Aug. 18, 1987 in the names of the inventors of the present patent application now U.S. Pat. No. 4,857,067, discloses processes for making superconductors. More specifically the patent application discloses a melt process based on molten barium-copper-oxides which allows high-quality R-Ba-Cu-O superconductors (wherein R is chosen from the group of rare earth metals excluding Tb, Pr, and Ce) to be easily constructed. The process can be utilized to make R-Ba-Cu-O superconductors in an arbitrary shape.

Other processes for making R-Ba-Cu-O superconductors have been reported. Some processes for making R-Ba-Cu-O superconducting wires have also been reported. These processes have not been entirely satisfactory because of low critical current densities and poor mechanical properties.

An improved superconducting wire and an improved process for making R-Ba-Cu-O superconducting wires is desirable for many reasons. Such a product and process could: (1) provide high-quality R-Ba-Cu-O superconducting wires; (2) provide superconducting wires that possess unique properties suitable to various special applications; (3) provide low cost processing and manufacturability; and (4) provide a guide to the manufacture of new and higher temperature superconducting wires that may be discovered in the future.

SUMMARY OF THE INVENTION

The present invention provides an improved superconducting wire and process for making R-Ba-Cu-O superconducting wires. The process includes the step of reacting molten barium-copper-oxides and rare earth oxides.

Pursuant to an embodiment of the method of the present invention, the R-Ba-Cu-O superconducting wires are produced in approximately three steps: (1) oxidation of a yttrium metal wire: (2) preparation and melting of a barium-copper-oxide mixture; and (3) coating the molten barium-copper-oxide mixture onto an oxidized yttrium wire. In an embodiment of the method, the method includes the step of annealing the coated yttrium wire.

Pursuant to the method of the present invention, superconducting wires can also be produced utilizing: Sm; Eu; Gd; Dy; Ho; Er; Tm; Yb; and Lu wires that are oxidized and coated with barium-copper oxides.

Pursuant to the present invention, a superconductor is created at an interface layer of the barium-copper-oxide layer and the yttrium oxide layer. Therefore, the present invention provides a superconducting wire that can include a protective barium-copper-oxide layer.

In an embodiment of the present invention, the barium-copper-oxides have a nominal composition represented by the formula $Ba_xCu_yO_z$ wherein: $0<x<10$; $0<y<10$; and $x+y-1<z<x+y+2$.

In an embodiment, the oxidized yttrium wire has the nominal composition: $Y_2O_3$.

Accordingly, an advantage of the present invention is that it provides a method for producing high-quality R-Ba-Cu-O superconducting wires.

A further advantage of the present invention is to provide a simple method for fabricating R-Ba-Cu-O superconducting wires without the need for sophisticated equipment.

A still further advantage of the present invention is that it provides a method for continuously fabricating R-Ba-Cu-O superconducting wires.

Another advantage of the present invention is that R-Ba-Cu-O superconducting wires can be fabricated that have a core constructed from a normal metal.

Furthermore, an advantage of the present invention is that R-Ba-Cu-O superconducting wires can include a barium-copper-oxide coating layer that protects the superconducting layer from degradation.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
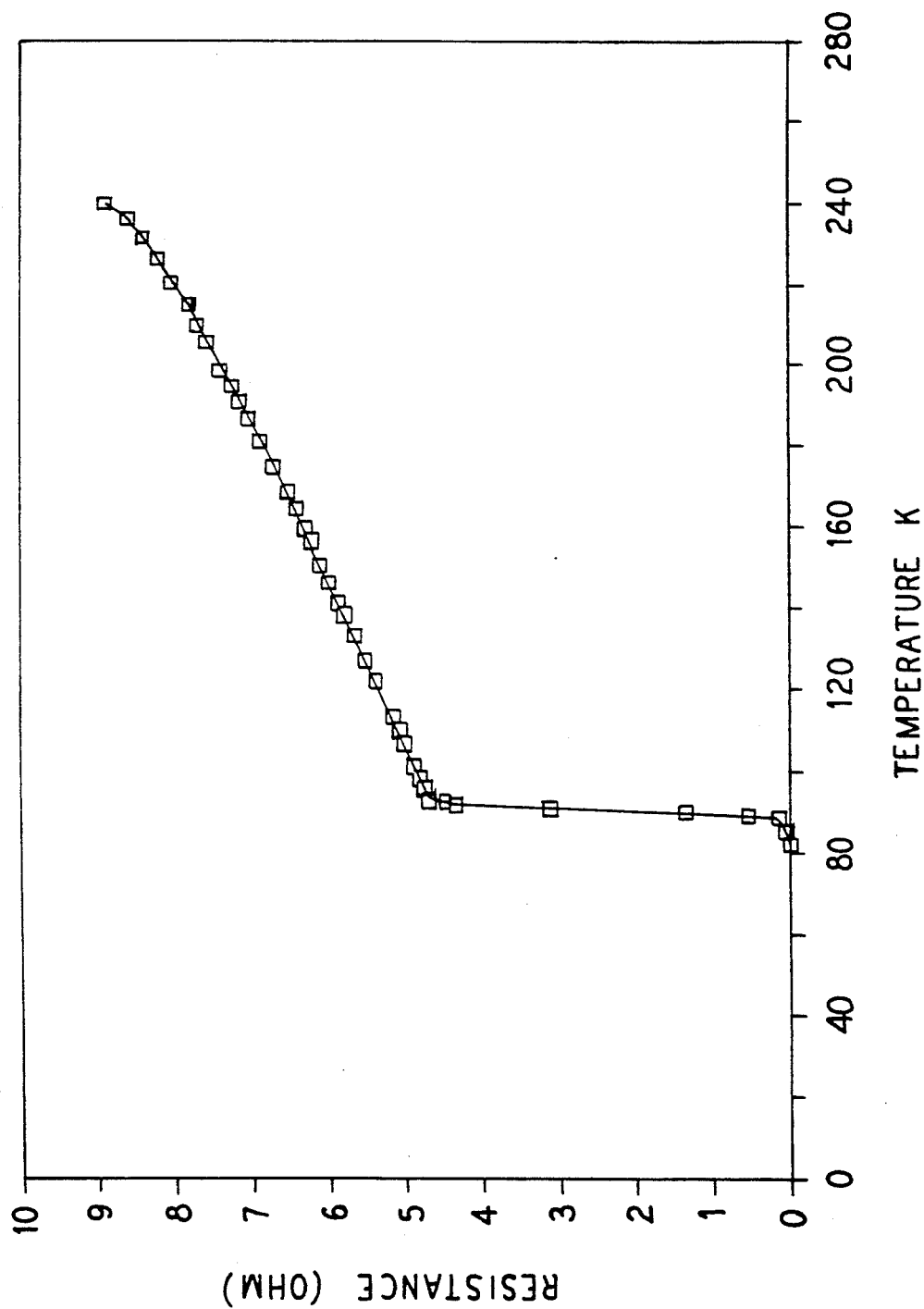
FIG. 1 illustrates, graphically, the relationship of electrical resistance versus temperature of a Y-Ba-Cu-O superconducting wire made pursuant to an embodiment of the method of the present invention.

The present invention provides a method for making high quality R-Ba-Cu-O superconducting wire, as well as wire made therefrom. Pursuant to the method of the present invention, molten barium-copper-oxide is coated onto an oxidized Y, Sm, Eu, Gd, Dy, Ho, Er, Tm, Yb, or Lu metal wire.

Briefly, in an embodiment of the method for making an R-Ba-Cu-O superconducting wire according to the present invention comprises three steps: (1) oxidizing a yttrium wire; (2) preparing a mixture of barium-copper-oxide and melting same; and (3) coating the oxidized yttrium wire with the molten barium-copper-oxide. In an embodiment, the method includes the step of annealing the coated yttrium wire.

In an embodiment, the method of the present invention provides high quality Y-Ba-Cu-O superconducting wires. Moreover, the method provides a simple, and relatively low cost procedure for processing and manufacturing Y-Ba-Cu-O superconducting wires.

Pursuant to the method of the present invention, a barium-copper-oxide mixture is prepared. The barium-copper-oxides are preferably produced by grinding and mixing either $BaCO_3$ and CuO or $BaO_2$ and CuO. In a preferred embodiment, the molar ratio of barium to copper, in the barium-copper-oxide mixture, is approximately 1 3 to about 2:3. It has been found that these oxides have the lowest melting points.

Preferably, after the grinding and mixing step, the powder is heated. In an embodiment, the barium-copper-oxide powder is heated in an atmospheric environment at approximately 900° C. for approximately 12 hours.

In an embodiment of the method of the present invention, the resultant powder has the following nominal composition:

$$Ba_xCu_yO_z$$

wherein: $0<x<10$; $0<y<10$; and $x+y-1<z<x+y+2$.

After the barium-copper-oxide powder has been prepared, it is then melted and coated onto, in an embodiment, an oxidized Yttrium wire. The yttrium wire is produced by extrusion from 1 mm thick Y wire (available from Aesar Company). As previously stated, Sm, Eu, Gd, Dy, Ho, Er, Tm, Yb, and Lu wires can also be used and a variety of well known methods can be used to produce these wires in arbitrary length, thickness and shape. The normal yttrium metal wire has a resistance of about 5 ohms for 2 inches Length, 1 mm thick at room temperature To create an oxidized yttrium wire, the wire is preferably heated in flowing oxygen. In an embodiment of the method of the present invention, the yttrium wire is oxidized in flowing oxygen at 500°–800° C. for about 14 hours. After the oxidation process, the yttrium oxide ($Y_2O_3$) on the core provides a resistance on the order of meg-ohms.

In order to coat the oxidized yttrium wire with barium-copper-oxide, the barium-copper-oxide powder is melted. The barium-copper-oxide powder can be melted by being heated in a furnace either alone or in a quartz boat. The oxidized yttrium wire is then coated with the molten barium-copper-oxide by being dipped in a barium-copper-oxide melt. The wire is preferably dipped for approximately 10 to about 20 seconds. This time has been found to be sufficient to coat a barium-copper-oxide melt onto an oxidized yttrium wire.

In an embodiment of the present invention, after the wire is coated, it is then annealed in flowing oxygen. In an embodiment, the coated wire is annealed in flowing oxygen at approximately 900°±5° C. for approximately 12 hours, followed by a furnace cooling.

After the wire is coated, it may be desirable to scratch or etch the surface of the coated wire to reach an interface layer between the barium-copper-oxide and yttrium oxide. It is this interface layer which is superconducting. Alternately, the excess barium-copper-oxide could be removed mechanically while it is in the molten state.

For example, in an embodiment of the method of the present invention, due to the layer of the $BaCu_3O_4$ at the surface of the wire, it may be necessary to scratch off some of the $BaCu_3O_4$ to reach the interface of the $BaCu_3O_4$ and $Y_2O_3$. The interface layer, which is superconducting, has the structure $YBa_2Cu_3O_{7-x}$. In the examples set forth below, it is at this interface layer that connections were made for resistance measurement.

By way of example and not limitation, examples of the method of the present invention for making high-quality R-Ba-Cu-O superconducting wires will now be given: Example 1:

A. The following reagents were utilized:
1. $BaCO_3$;
2. CuO; and
3. Yttrium metal wire.

B. The following procedure was followed:
1. A mixture of a two molar portion of $BaCO_3$ and a three molar portion of CuO was ground with an agate mortar and pestle. The mixture was then heated in air at 900° C. for more than 12 hours to obtain a uniform black $Ba_2Cu_3O_5$ powder.
2. A yttrium wire was placed in a tube furnace for 12 hours at 800° C. in flowing oxygen.
3. The $Ba_2Cu_3O_5$ powder was placed in a boat, and the boat was placed in a furnace and heated at 1000° C. for two hours. The powder was thereby melted. The yttrium wire was dipped into the molten solution for 15 seconds, to coat same, and taken out.
4. The coated yttrium wire was then annealed for 12 hours at 900°±5° C. in flowing oxygen.

The wire, produced pursuant to this example, formed a superconductive layer under the $Ba_2Cu_3O_5$ coating. FIG. 1 illustrates, graphically, the resistance of the Y-Ba-Cu-O wire made pursuant to this example, as a function of temperature. The resistance was measured at the interface layer of the $Ba_2Cu_3O_5$ and $Y_2O_3$. The wire reached zero resistance at 83° K.

EXAMPLE 2

A. The following reagents were utilized:
$BaCO_3$;
2. CuO; and
3. Yttrium metal wire.

B. The following procedure was followed:
1. A mixture of a one molar portion of $BaCO_3$ and a three molar portion of CuO was ground with an agate mortar and pestle. The mixture was then heated in air at about 900° C. for more than 12 hours to obtain a uniform black $BaCu_3O_4$ powder.
2. A yttrium wire was placed in a tube furnace for 12 hours at 650° C. in flowing oxygen. After oxidation, the yttrium wire provided a resistance on the order of megaohms.
3. The $BaCu_3O_4$ powder was put in a boat, and heated in a furnace to 1000° C. for two hours. The powder was thereby melted. The yttrium wire was dipped in this molten solution for 15 seconds, to coat same, and was then taken out.
4. The coated yttrium wire was annealed for 12 hours at 900°±5° C. in flowing oxygen.

Figure 2:
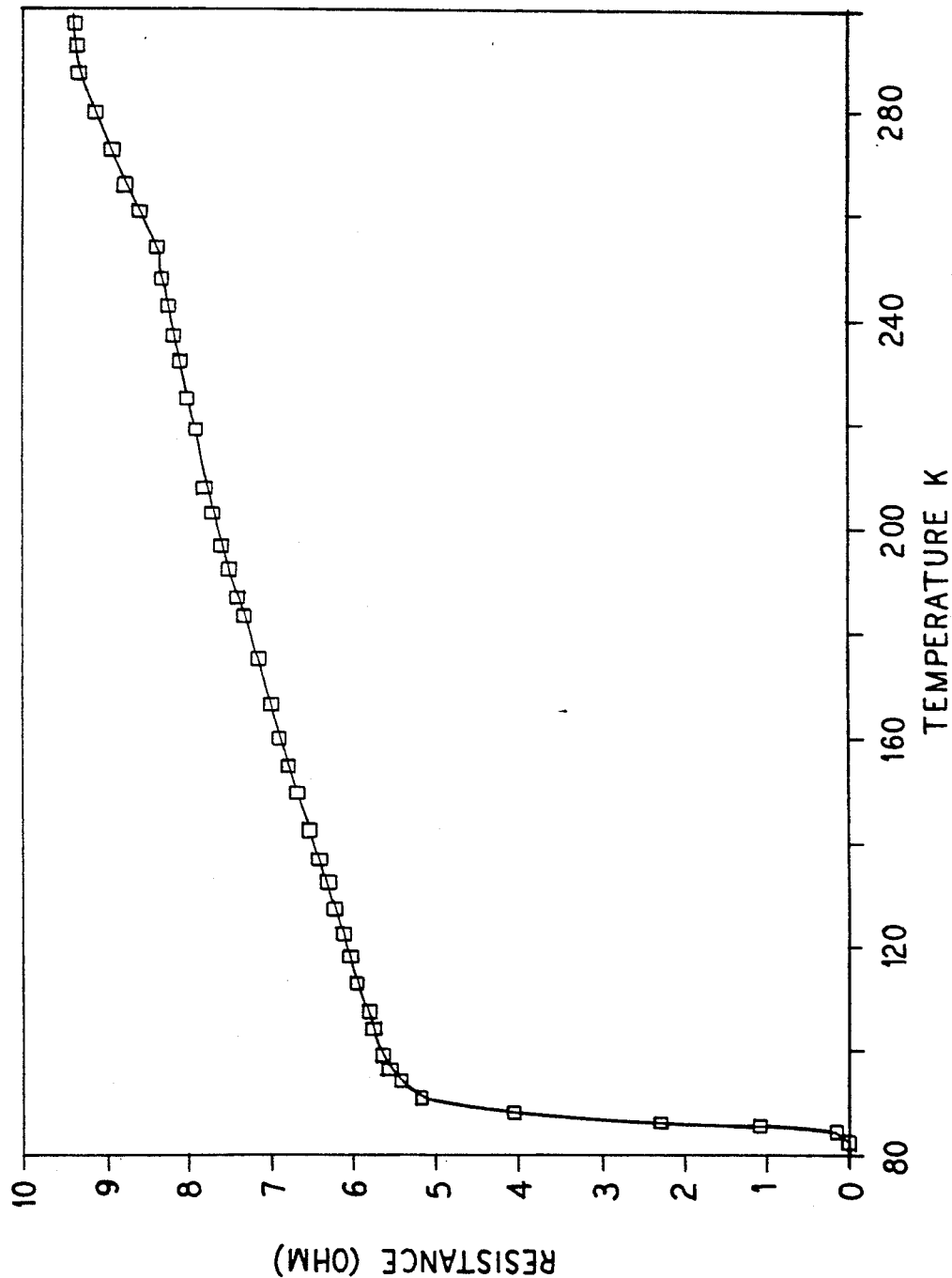
FIG. 2 illustrates, graphically, the relationship of electrical resistance versus temperature of a Y-Ba-Cu-O superconducting wire made pursuant to an embodiment of the method of the present invention.

The wire prepared pursuant to this example, formed a superconductive layer under the $BaCu_3O_4$ coating. FIG. 2 illustrates, graphically, the resistance as a function of temperature for a Y-Ba-Cu-O wire made pursuant to this example. The resistance was measured at the interface layer of the $BaCu_3O_4$ and $Y_2O_3$. The wire reached a zero resistance at 90° K.

EXAMPLE 3

A. The following reagents were utilized:
1. $BaCO_3$;
2. CuO; and
3. Yttrium metal wire.

B. The following procedure was followed:
1. A mixture of a one molar portion of $BaCO_3$ and a three molar portion of CuO was ground with an agate mortar and pestle. The mixture was then heated in air at 900° C. for more than 12 hours to obtain a uniform black $BaCu_3O_4$ powder.

2. A yttrium wire was placed in a tube furnace for 12 hours at 500° C. in flowing oxygen. After oxidation, the yttrium Wire gave a resistance on the order of megaohms.

3. The $BaCu_3O_4$ powder was put in a boat, and heated in a furnace to 1000° C. for two hours. The powder was thereby melted. The yttrium wire was then dipped in the molten solution for 15 seconds, to coat the wire with same, and then removed.

4. The coated yttrium wire was annealed for 12 hours at 900°±5° C. in flowing oxygen.

Figure 3:
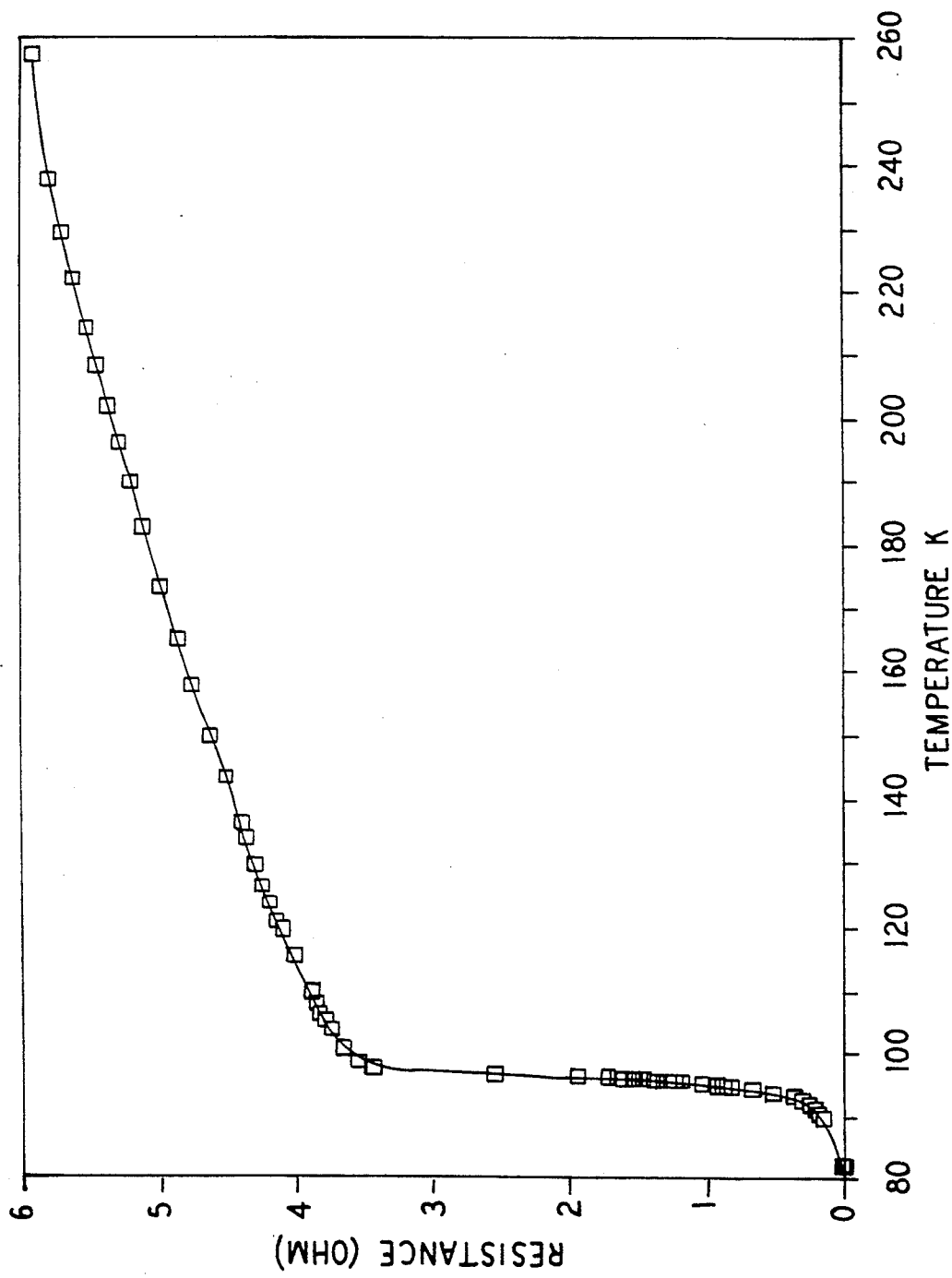
FIG. 3 illustrates, graphically, the relationship of electrical resistance versus temperature of a Y-Ba-Cu-O superconducting wire made pursuant to an embodiment of the method of the present invention.

A wire prepared pursuant to this example formed a superconductive layer under the $BaCu_3O_4$ coating. FIG. 3 illustrates, graphically, the resistance as a function of temperature for a Y-Ba-Cu-O wire made pursuant to this example. The resistance was measured at the $BaCu_3O_4$ and $Y_2O_3$ interface. The wire did not reach zero, but there was a sharp transition. Minimum resistance achieved for this wire was 0.02 ohms. The inventors of the present invention believe that this may have been due to silica contamination from the quartz boat which was used for the molten $BaCu_3O_4$.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for making a superconducting wire comprising the steps of:
    oxidizing a yttrium wire to create an oxidized yttrium wire;
    melting a barium-copper-oxide mixture to create a melted barium-copper-oxide mixture;
    coating the oxidized yttrium wire the melted barium-copper-oxide mixture; and
    annealing a resultant coated yttrium wire.

2. The method of claim 1 wherein the barium-copper-oxide has a nominal composition represented by the formula:

$$Ba_xCu_yO_z$$

wherein:
$0<x<10; 0<y<10;$ and $x+y-1<z<x+y+2.$

3. The method of claim 1 including the step of grinding and mixing a mixture chosen from the group consisting of $BaCO_3$ and CuO, and $BaO_2$ and CuO to create the barium-copper-oxide mixture.

4. The method of claim 1 wherein the molar ratio of barium to copper in the mixture is approximately 1:3 to about 2:3.

5. The method of claim 1 including the step of scratching or etching a surface of a coated oxidized yttrium wire so that a yttrium oxide barium-copper-oxide interface layer can be accessed.

6. A method for making a high temperature superconducting wire comprising the steps of:
    a. grinding a mixture of barium and copper selected from the group consisting of $BaCO_3$ and CuO, and $BaCO_2$ and CuO;
    b. heating the ground mixture to obtain a $Ba_xCu_yO_z$ powder;
    c. oxidizing a yttrium wire;
    d. melting the $Ba_xCu_yO_z$ mixture;
    e. coating of oxidizing yttrium wire with molten $Ba_xCu_yO_z$; and
    f. annealing a resultant coated yttrium wire.

7. The method of claim 6 wherein:

$$0<x<10;$$

$$0<y<10; \text{ and}$$

$$x+y-1<z<x+y+2.$$

8. The method of claim 6 wherein the mixture of step b) is heated at approximately 900° C. for 12 hours.

9. The method of claim 6 wherein the yttrium wire is oxidized at approximately 500° C. to about 800° C. for about 12 hours.

10. The method of claim 6 wherein the yttrium wire is oxidized at approximately 800° C. for about 12 hours.

11. The method of claim 6 wherein the mixture in step c) is placed in a boat and heated until it is completely melted.

12. The method of claim 6 including the steps of dipping the oxidized yttrium wire in molten $Ba_xCu_yO_z$ for approximately 10 to about 20 seconds.

13. The method of claim 6 wherein a coated yttrium wire is annealed for 12 hours at 900°±5° C. in flowing oxygen.

14. The method of claim 6 wherein a coated yttrium wire is etched to contact an interface layer between a yttrium oxide layer and a barium-copper-oxide layer.

15. The method of claim 6 wherein the $Ba_xCu_yO_z$ powder has a composition of $Ba_2Cu_3O_5$.

16. The method of claim 6 wherein the $Ba_xCu_yO_z$ powder has a composition of $BaCu_3O_4$.

* * * * *